(12) United States Patent
Lee

(10) Patent No.: US 7,777,275 B2
(45) Date of Patent: Aug. 17, 2010

(54) SILICON-ON-INSULATOR STRUCTURES

(75) Inventor: Ming-Hsiu Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 557 days.

(21) Appl. No.: 11/383,973

(22) Filed: May 18, 2006

(65) Prior Publication Data

US 2007/0267695 A1    Nov. 22, 2007

(51) Int. Cl.
*H01L 27/12* (2006.01)

(52) U.S. Cl. .................. 257/347; 257/506; 257/618; 257/E29.287

(58) Field of Classification Search .......... 257/347, 257/E29.87, 499, 506, 618; 438/138, 149
See application file for complete search history.

(56) References Cited

U.S. PATENT DOCUMENTS

| | | | |
|---|---|---|---|
| 5,159,416 A * | 10/1992 | Kudoh | 257/384 |
| 5,234,535 A | 8/1993 | Beyer et al. | |
| 6,034,399 A * | 3/2000 | Brady et al. | 257/355 |
| 6,251,754 B1 | 6/2001 | Ohshima et al. | |
| 6,291,845 B1 | 9/2001 | Blanchard | |
| 6,362,070 B1 | 3/2002 | Villa et al. | |
| 6,380,037 B1 * | 4/2002 | Osanai | 438/294 |
| 6,489,654 B2 | 12/2002 | Ogura | |
| 6,541,356 B2 | 4/2003 | Fogel et al. | |
| 6,630,714 B2 | 10/2003 | Sato et al. | |
| 6,855,588 B1 | 2/2005 | Liao et al. | |
| 6,906,384 B2 * | 6/2005 | Yamada et al. | 257/347 |
| 7,049,661 B2 * | 5/2006 | Yamada et al. | 257/347 |

* cited by examiner

*Primary Examiner*—Tuan N. Quach
(74) *Attorney, Agent, or Firm*—Jianq Chyun IP Office

(57) ABSTRACT

Methods which include providing a single crystal silicon substrate having a device pattern formed on a portion of the substrate where the device pattern has a protrusion, forming a protection layer on a portion of the protrusion, and forming an oxide insulation layer between the protrusion and the substrate using a thermal oxidation process; methods of forming a partial SOI structure which include providing a single crystal silicon substrate having a device pattern formed thereon where the device pattern comprises a non-SOI region and an SOI region having a protrusion, forming a protection layer on a portion of the protrusion, and forming an oxide insulation layer between the protrusion and the substrate using a thermal oxidation process; structures formed by such methods; and partial silicon-on-insulator structures comprising a single crystal silicon substrate having an device pattern disposed on a surface thereof where the device pattern includes a non-SOI region and an SOI region having a protrusion, and an oxide insulation layer disposed in the device pattern where a portion of the insulation layer is disposed under the protrusion such that the protrusion is isolated from the single crystal substrate, and where the non-SOI region is not isolated from the single crystal structure.

5 Claims, 10 Drawing Sheets

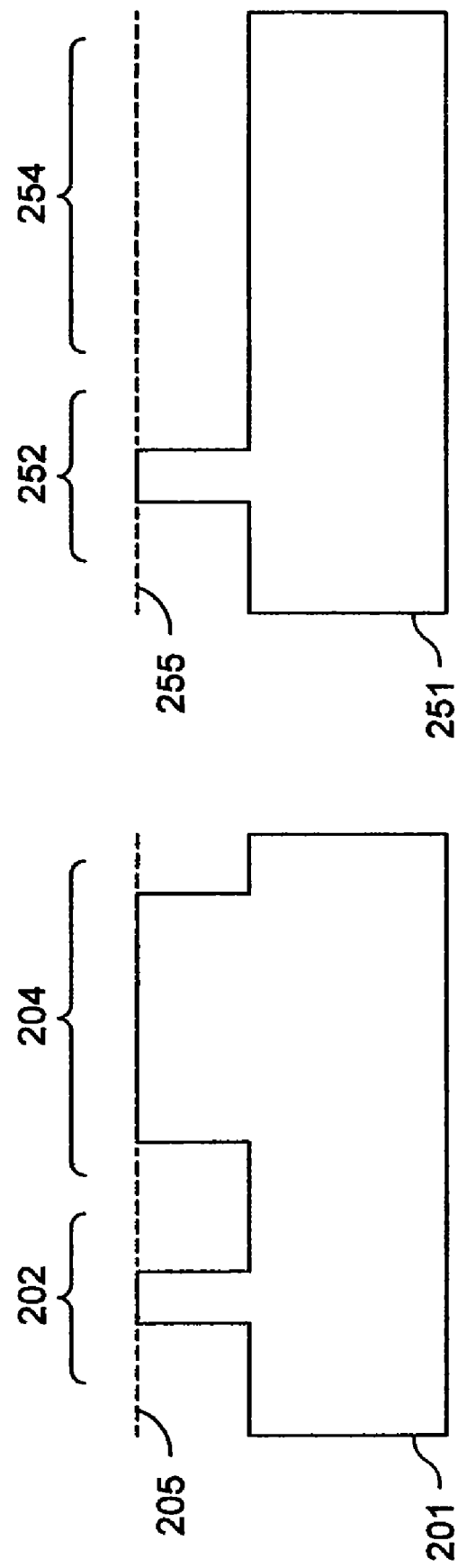

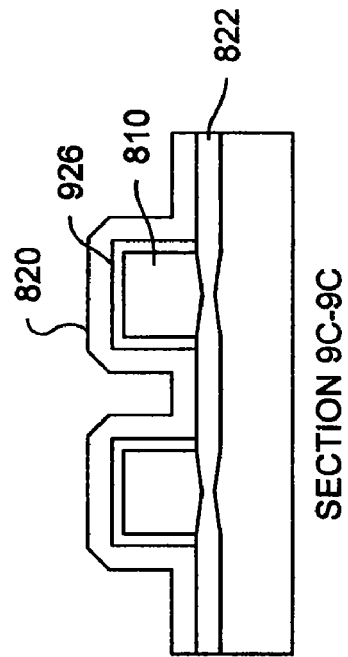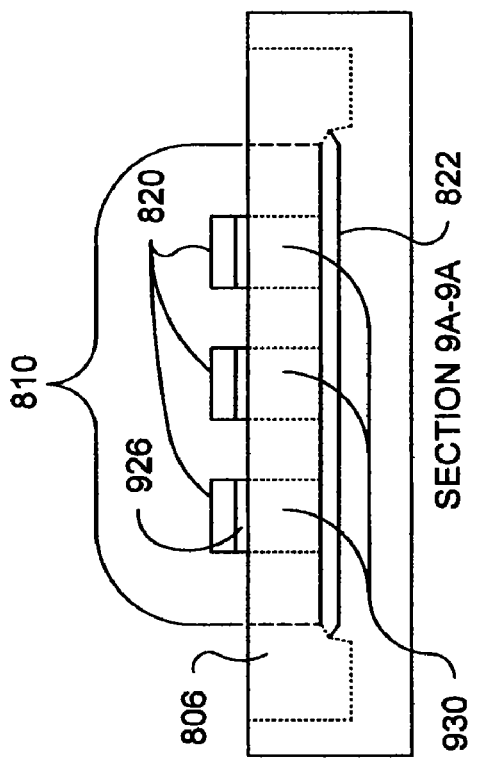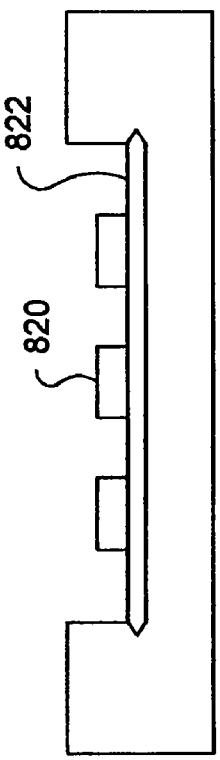

SILICON-ON-INSULATOR STRUCTURES

BACKGROUND OF THE INVENTION

Silicon-on-insulator (SOI) structures are commonly used for advanced semiconductor devices due to their low off-leakage, low gate parasitic capacitance, and latch-up free characteristics. Examples of conventional methods for forming SOI devices include: 1) wafer bonding and separating; 2) high energy oxygen implantation followed by high temperature annealing (often referred to as "SIMOX"); and 3) hydrogen ion separation processes.

Each of these conventional methods can be very expensive due to complicated manufacturing processes and the need for special tools. Some of these methods are also limited in use by necessitating placement of all or none of the devices on the SOI layers. Controlling the thickness of the SOI can also be difficult. The hydrogen ion separation processes can also cause particle defects in the SOI film and/or at interfaces thereof. In addition, in some of the high energy oxygen implantation methods, the silicon material outside of the active regions can become poly-crystalline in structure, which results in higher resistances.

BRIEF SUMMARY OF THE INVENTION

The present invention relates generally to SOI and partial SOI structures and more particularly, to methods of forming such SOI and partial SOI structures. Methods in accordance with the present invention include advantageous routes for forming SOI structures which can be formed entirely as SOI regions or as partial SOI regions in conjunction with non-SOI regions. Unless specifically referred to as a "partial" SOI structure, references herein to "an SOI structure" can refer to either an SOI structure or partial SOI structure.

The present invention provides methods of forming SOI regions for small devices, while at the same time allowing large devices to be manufactured on traditional non-SOI substrate regions that can provide better thermal conductivity for those devices. Moreover, methods in accordance with the present invention are less complex, and thus, more economically desirable. Furthermore, methods in accordance with the present invention allow greater control of the thickness of SOI devices.

One embodiment of the present invention includes methods comprising: providing a single crystal silicon substrate having a device pattern formed on a portion of the substrate, the device pattern comprising a protrusion; forming a protection layer on a portion of the protrusion; and forming an oxide insulation layer between the protrusion and the substrate using a thermal oxidation process.

Another embodiment of the present invention includes methods of forming a partial SOI structure comprising: providing a single crystal silicon substrate having a device pattern formed thereon, wherein the device pattern comprises a non-SOI region and an SOI region having a protrusion; forming a protection layer on a portion of the protrusion; and forming an oxide insulation layer between the protrusion and the substrate using a thermal oxidation process.

Additional embodiments of the present invention include SOI structures prepared using a method in accordance with any of the embodiments described herein.

In several embodiments of the present invention forming an oxide insulation layer includes thermal oxidation. Both SOI and non-SOI device regions can be manufactured using methods according to the present invention. In certain embodiments, a protection layer can comprise a silicon nitride ($Si_xN_y$, or simply "SiN") material. A protection layer can be used to define the SOI and non-SOI regions in that those areas of a device pattern covered by a protection layer are protected from oxidation whereas the areas not covered by a protection layer are oxidized. Accordingly, through selective placement of a protection layer or layers and additionally by adjustment of the protection layer thickness, thermal oxidation can be controlled to provide SOI regions wherein an oxide insulation layer is formed between the protrusion and the substrate, and non-SOI regions where the protection layer and/or the width of the non-SOI region prevents the formation of an oxide insulation layer under the non-SOI region leaving the non-SOI region unisolated from the substrate.

Another embodiment of the present invention includes structures which comprise a device pattern on a single crystal silicon substrate, wherein the device pattern includes a protrusion extending outward from the substrate, and an oxide insulation layer formed on the substrate and under the protrusion using a thermal oxidation process such that the oxide insulation layer isolates the protrusion from the substrate.

Yet another embodiment of the present invention includes partial silicon-on-insulator structures comprising: a single crystal silicon substrate having an device pattern disposed on a surface thereof, the device pattern comprising a non-SOI region and an SOI region having a protrusion; and an oxide insulation layer disposed in the device pattern wherein a portion of the insulation layer is disposed under the protrusion such that the protrusion is isolated from the single crystal substrate, and wherein the non-SOI region is not isolated from the single crystal structure The present invention provides a convenient and inexpensive SOI formation method, which does not require a new process module.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 2A is a schematic diagram of a single crystal substrate having an SOI device region and a non-etched non-SOI device region, according to an embodiment of the present invention.

FIG. 2B is a schematic diagram of a single crystal substrate having an SOI device region and an etched non-SOI device region, according to an embodiment of the present invention.

FIG. 9A is a schematic diagram of a cross-section of the NAND memory array of FIG. 8, taken along line 9A-9A.

FIG. 9B is a schematic diagram of a cross-section of the NAND memory array of FIG. 8, taken along line 9B-9B.

FIG. 9C is a schematic diagram of a cross-section of the NAND memory array of FIG. 8, taken along line 9C-9C.

DETAILED DESCRIPTION OF THE INVENTION

Figure 1A:
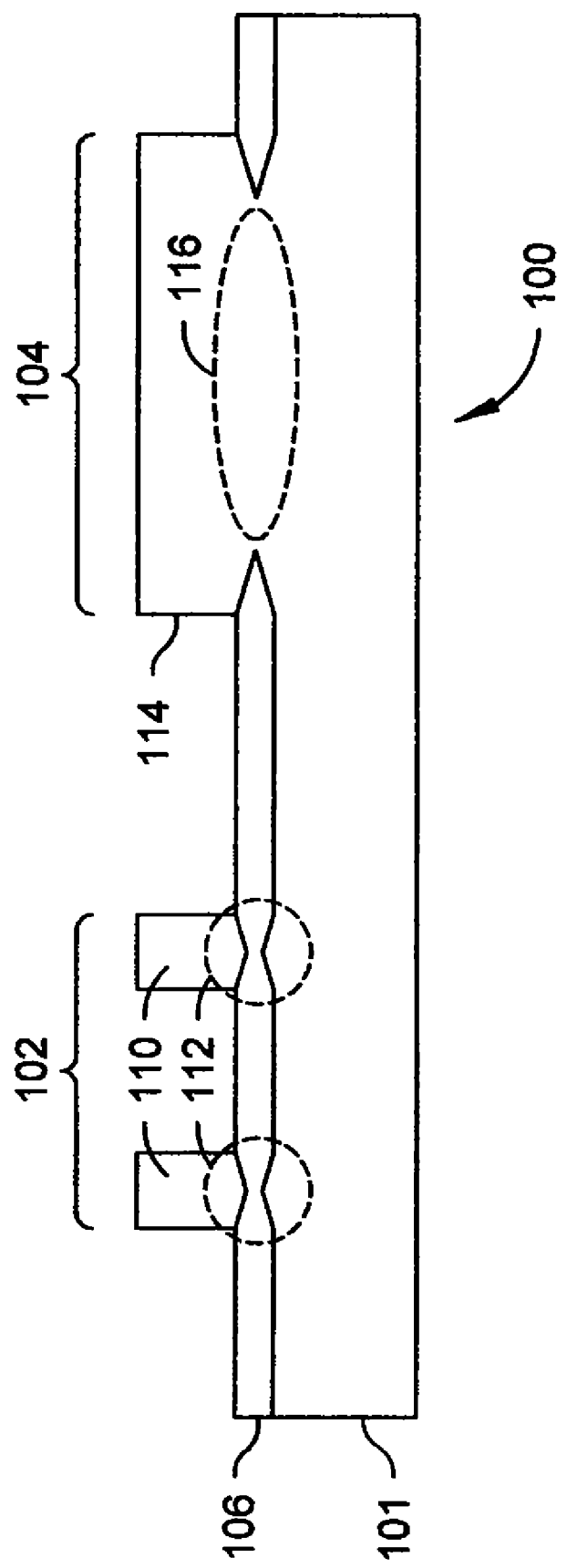
FIG. 1A is a schematic diagram of a partial SOI structure, according to an embodiment of the present invention.

Reference will now be made in detail to the invention and the presently preferred embodiments thereof, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as top, bottom, left, right, up, down, above, below, beneath, rear, and front, are used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation. It is to be understood and appreciated that the process steps and structures described herein do not cover a complete process flow for the manufacture of entire integrated circuits. The present invention may be practiced in conjunction with various integrated circuit fabrication techniques that can be used in the art either known or to be developed.

FIG. 1A illustrates a partial SOI structure 100, according to one embodiment of the present invention. As shown, structure 100 includes a single crystal substrate 101 having a device pattern which comprises a small device region 102 and a large device region 104. An oxide insulating layer 106 is formed on the substrate 101 between the substrate 101 and the devices 110. The small device region 102 where the oxide insulating layer 106 is disposed below the devices 110 comprises an SOI-region where the devices 110 are isolated from the substrate 101. The large device region 104 comprises a non-SOI region where the large device 114 is not isolated from the substrate 101. Each device depicted in FIG. 1A represents a protrusion (extending outward from the substrate) in the device pattern. A single crystal substrate in accordance with the present invention can comprise single crystal silicon having long-range crystalline order throughout most if not all of the material. As used herein, single crystal silicon substrates refer to crystalline silicon materials having electronic properties which are preferably superior to polycrystalline and amorphous materials and are generally ordered in crystalline structure throughout the entire material, but does not necessarily imply 100% crystal perfection. High grade single crystal silicon substrates having long-range crystalline order throughout the entire device region are preferred.

The oxide insulating layer 106 can be formed using a thermal oxidation process. When a device is small enough, such as devices 110, the oxide insulating layer 106 is formed in the device pattern from both sides of the device and ultimately forms an oxide insulating (isolation) layer under the small single crystal device. This isolation layer under the small device is shown at locations 112. As used herein, a "small" device refers generally to a protrusion in the device pattern having a width sufficiently small enough for the oxide layer to be grown from each side such that the two layers meet beneath the protrusion to isolate the protrusion from the underlying substrate. The particular maximum width of a "small" device can vary on the basis of oxidation parameters such as oxidation time and temperature, oxidation chemicals, and may also vary based on the thickness of the protection layer. Oxidation time, temperature and chemical recipe can be adjusted in conjunction with protection layer thickness to accommodate varying small device widths.

In various preferred embodiments, an oxidation process can be carried out to isolate a "small" device protrusion having a width of about 400 nm or less. In certain preferred embodiments, a thermally grown oxide layer can extend under a 200 nm wide protrusion from both sides and meet to form an insulating (isolation) layer under a protrusion where the oxidation is carried out at a temperature of about 750° C. to about 1100° C. for a time duration of about 1 hour to about 24 hours, where the protection layer comprises silicon nitride spacers having a thickness of about 200 nm.

As used herein, the formation and/or disposition of an oxide insulation layer "in the device pattern" refers generally to the formation/disposition of the oxide layer on various surfaces of the substrate adjacent to, under, and/or on the various protrusions and regions of the device pattern. For example, referring to FIG. 1A, an oxide insulation layer disposed in the device pattern can comprise a layer 106 disposed on a surface of the substrate 101 in areas adjacent to and under small devices 110 and large device 114.

As shown in FIG. 1A, the ends of the oxide insulating layer can have a characteristic "bird's beak" shape, which can result from the thermal growth of the oxide. However, while it is generally recognized that thermally grown oxide layers will form such a characteristic bird's beak shape at the growth ends of the layer, it is to be understood that the portions of the oxide insulating layer (isolation layer) of the present invention which meet below a protrusion to isolate the protrusion from the substrate are not limited to any specific shape, so long as they join below a device region (i.e., protrusion) to be isolated.

For larger devices, such as device 114, and in regions where an SOI structure is not desired, the oxide insulating layer 106 does not come together to isolate the device because, in the case of larger devices, the greater width of the device prevents joining of the oxide insulating layer under the device. As used herein, a "larger device" refers to a protrusion or region having a width greater than 1000 nm. In the case of regions with small devices where an SOI structure is not desired, formation of an oxide insulating layer under the small device can be prevented by a protective layer formed over the entire device and adjacent portions of the substrate. Thus, large devices and regions where an SOI structure is not desired are not isolated by the oxide insulating layer. The area 116 at the bottom of device 114 shows where the oxide insulating layer 106 formed from both sides of the device does not join to form an isolation layer.

Figure 1B:
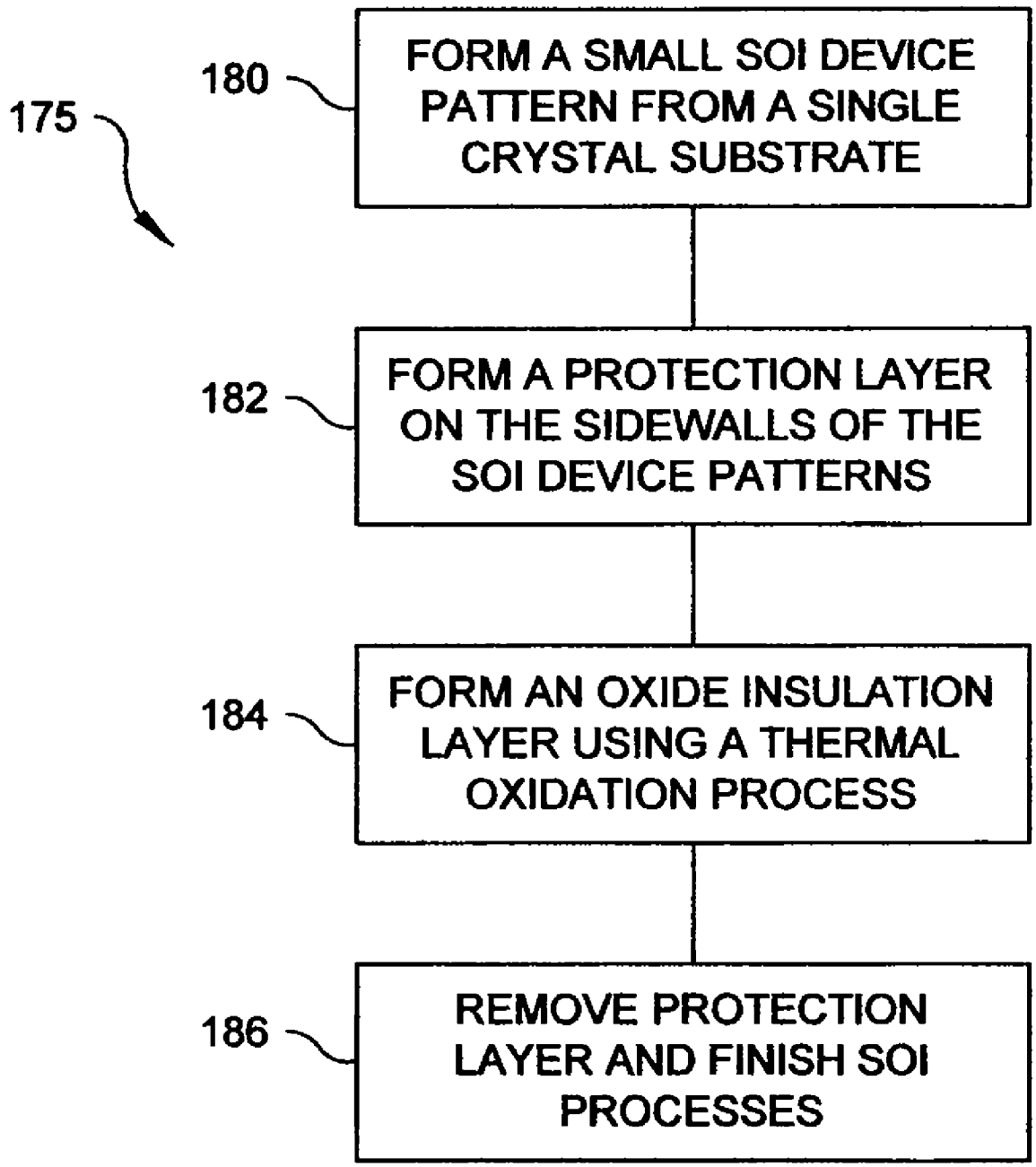
FIG. 1B is a flowchart outlining an exemplary method for forming a partial SOI structure, according to an embodiment of the present invention.

FIG. 1B is a flowchart which outlines an exemplary method 175 for forming a partial SOI structure, such as the structure 100 shown in FIG. 1A. FIGS. 2A-6B are illustrative of steps in accordance with an embodiment of exemplary method 175 for forming a partial SOI structure.

As indicated in FIG. 1B, the method 175 in accordance with the embodiment of the present invention illustrated includes 180 forming a device pattern on a single crystal substrate, where the device pattern includes an SOI region and a non-SOI region. The pattern can be provided by, for example, a lithography and etching process or by a direct-write etching process. The large device regions and the non-SOI regions can be etched or non-etched from the original wafer surface.

Referring to FIG. 2A, for example, a structure in accordance with one embodiment of the present invention comprises a single crystal substrate 201 having an SOI device region 202 and a non-etched non-SOI device region 204. Line 205 indicates the original wafer surface. Referring to FIG. 2B, for example, a structure in accordance with one embodiment of the present invention comprises a single crystal substrate 251 having an SOI device region 252 and an etched non-SOI device region 254. Line 255 indicates the original wafer surface.

As indicated in FIG. 1B, method 175 also includes 182 the formation of a protection layer on the sidewalls of the protrusions in the SOI region. In some embodiments of the present invention, the device pattern comprises a protrusion having a sidewall and an upper surface. Protrusions comprising a device pattern in an SOI regions, a non-SOI regions or both can have a sidewall and an upper surface. A protection layer can be formed by, for example, a protection layer spacer process or a protection layer capping process. Regions in which no SOI is required can be protected by reserved protection layer patterns. The protection layer can comprise any material able to form an interface with the single crystal substrate that prevents oxygen from entering and contacting the substrate. Examples of suitable protection layer materials include, but are not limited to, nitrides and carbides. For example, a protection layer can comprise silicon nitride and/or silicon carbide. Protection layers, including spacer protection layers, capping protection layers and reserved protection layers preferably each comprise silicon nitride.

Figure 3B:
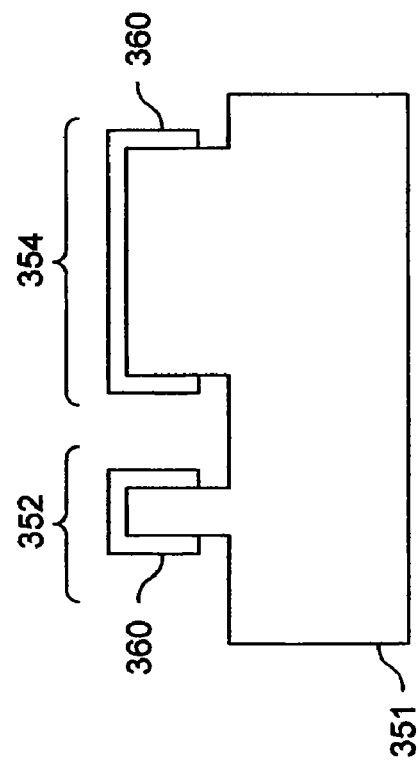
FIG. 3B is a schematic diagram showing the formation of a protective layer on the sidewalls of an SOI device using a SiN capping process, according to an embodiment of the present invention.
Figure 3A:
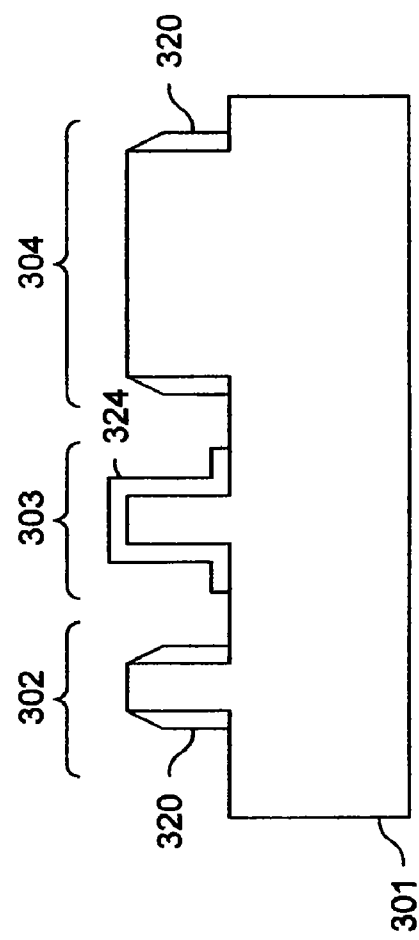
FIG. 3A is a schematic diagram showing the formation of a protective layer on the sidewalls of an SOI device using a SiN spacer process, according to an embodiment of the present invention.

Referring to FIG. 3A, an example of spacer protection layer formation on one or more sidewalls of a protrusion in a device pattern in accordance with one embodiment of the present invention is illustrated. Spacer protection layers can be formed, for example, via optional pad oxide deposition, silicon nitride deposition, followed by silicon nitride spacer etching. For example, a conformal layer of SiN can be deposited using any suitable thin film deposition process. The silicon nitride can be deposited over an optional pad oxide layer. After the thin film of SiN is deposited, an anisotropic etch process can be used to directionally remove SiN material from the substrate leaving SiN adjacent to only the sidewalls of the protrusions. A pad oxide layer can be deposited between the silicon and the SiN as a buffer to help reduce interfacial stress between the materials. Referring to FIG. 3A, for example, a spacer protection layer 320 can be formed on an SOI device 302 and/or a non-etched non-SOI device 304. A reserved protection layer 324, comprising SiN for example, can also be formed on a reserved non-SOI region 303. The SOI device 302, reserved non-SOI region 303, and non-SOI device 304 are formed from a single crystal substrate 301.

Referring to FIG. 3B, for example, a protection layer comprising a capping protection layer is illustrated. The formation of a protection layer on the sidewalls of an SOI device using a capping process, according to one embodiment of the present invention, can include, for example, deposition of a thick oxide layer adjacent to the device to be capped, etching back to fill in the space adjacent to the device, optional pad oxide deposition, and SiN deposition, followed by an oxide etch process to remove the thick oxide layer. Any techniques for such deposition and etching known in the art or to be developed can be used. As shown in FIG. 3B, for example, a SiN cap 360 can be formed on an SOI device 352 and a non-etched non-SOI device 354. The SOI device 352 and non-SOI device 354 are formed from a single crystal substrate 351.

Referring once again to FIG. 1B, method 175 also includes 184 forming an oxide insulation layer using a thermal oxidation process. Thermal oxidation grows the oxide insulation layer into the bottom of the device region and forms the oxide insulation layer under the protection layer. The small device region becomes isolated from the substrate when the oxide layer from both sides of a small device joins to form an isolation layer under the small device.

Figure 4B:
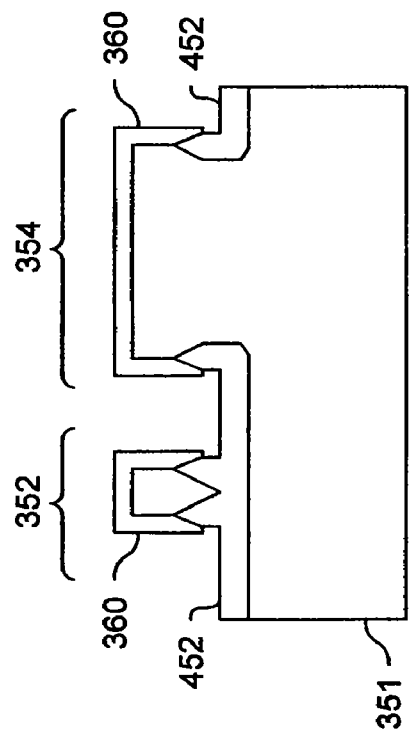
FIG. 4B is a schematic diagram showing the formation of an oxide insulation layer on the structures with SiN cap protection shown in FIG. 3B, according to an embodiment of the present invention.
Figure 4A:
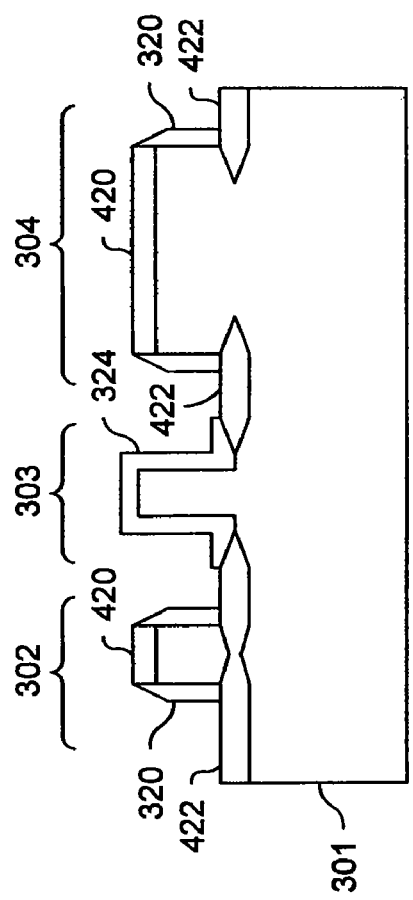
FIG. 4A is a schematic diagram showing the formation of an oxide insulation layer on the structures with SiN spacer protection shown in FIG. 3A, according to an embodiment of the present invention.

Referring to FIG. 4A, an example of forming an oxide insulation layer on the structures with spacer protection depicted in FIG. 3A in accordance with one embodiment of the present invention is illustrated. For example, thermal oxidation provides a cap oxide layer 420 on the SOI device 302 and the non-SOI device 304, and a bird's beak oxide layer 422 grown into the bottom of the SOI device 302. Under the small SOI device 302, the portions of the bird's beak oxide layer 422 coming from each side of the small SOI device 302 meet and combine to form an isolation layer under the small SOI device 302. The bird's beak oxide layer 422 remains apart under the reserved non-SOI region 303 and the non-SOI device 304. The reserved non-SOI region 303 and the non-SOI device 304 are not isolated from the single crystal substrate.

Referring to FIG. 4B, for example, formation of an oxide insulation layer on the structures with cap protection depicted in FIG. 3B, according to one embodiment of the present invention, is illustrated. As shown, thermal oxidation provides bird's beak oxide layer 452 growth into the bottom of the device regions. Under the small SOI device 352, the bird's beak oxide layer 452 coming from both sides of the small SOI device 352 meets and combines to form an isolation layer under the small SOI device 352. The bird's beak oxide layer 452 remains apart under the non-SOI device 354 which remains unisolated.

Referring once again to FIG. 1B, method 175 also includes 186 removing the protection layer, and further includes finishing the SOI processes. The cap oxide layer on the tops of the structures can be maintained or removed, depending on the integration concerns. The cap oxide layer on the tops can be removed, for example, by an etch-back process (e.g., gap fill-in, lithography, then etch-back) or by chemical mechanical processing (CMP) (e.g., gap fill-in, then CMP).

Figure 5:
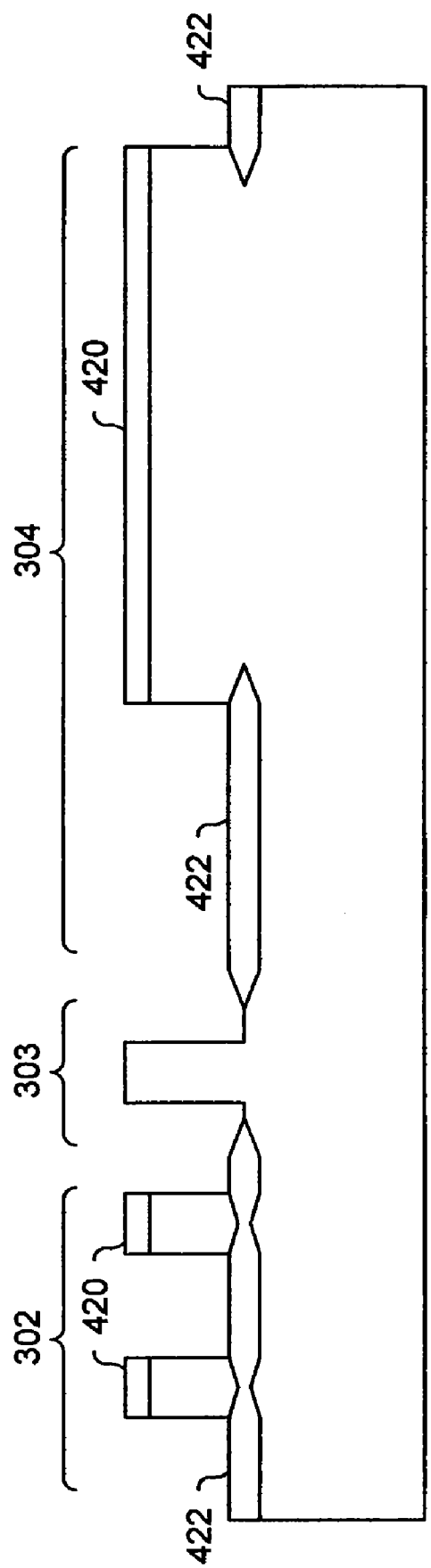
FIG. 5 is a schematic diagram showing the removal of the protection layer, with the cap oxide layer on the tops of the structures kept intact, according to an embodiment of the present invention.

FIG. 5 illustrates the removal of the protection layer, with the cap oxide layer on the tops of the structures kept intact, according to an embodiment of the present invention. Removal of the protection layer can be accomplished using any suitable etching technique including both wet and dry etching recipes. As shown, the protection layers 320 and 324 (see FIG. 4A) have been removed from the small SOI device region 302, the reserved non-SOI region 303, and the non- SOI device region 304. The cap oxide layer 420 remains in place on the small SOI device region 302 and the non-SOI device region 304. Removal of a protection layer without removal of a cap oxide layer can be carried out using any etch technique and recipe which selectively removes protection layer material to a greater degree than, or faster than, it removes oxide material.

Figure 6A:
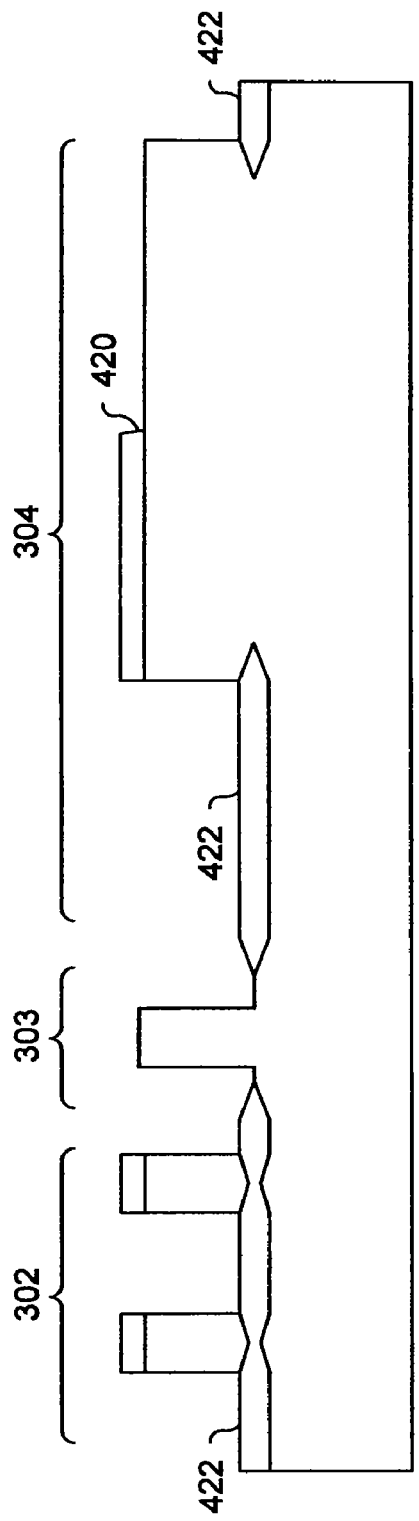
FIG. 6A is a schematic diagram showing the partial removal of the cap oxide layer shown in FIG. 5, according to an embodiment of the present invention.

FIG. 6A illustrates the partial removal of the cap oxide layer 420 shown in FIG. 5, according to one embodiment of the present invention. As shown, a portion of the cap oxide layer 420 has been removed from the non-SOI device region 304. Partial removal of a cap oxide layer can be carried out using suitable patterning and etching techniques, including, for example, photolithographic processes and dry or wet etching.

Figure 6B:
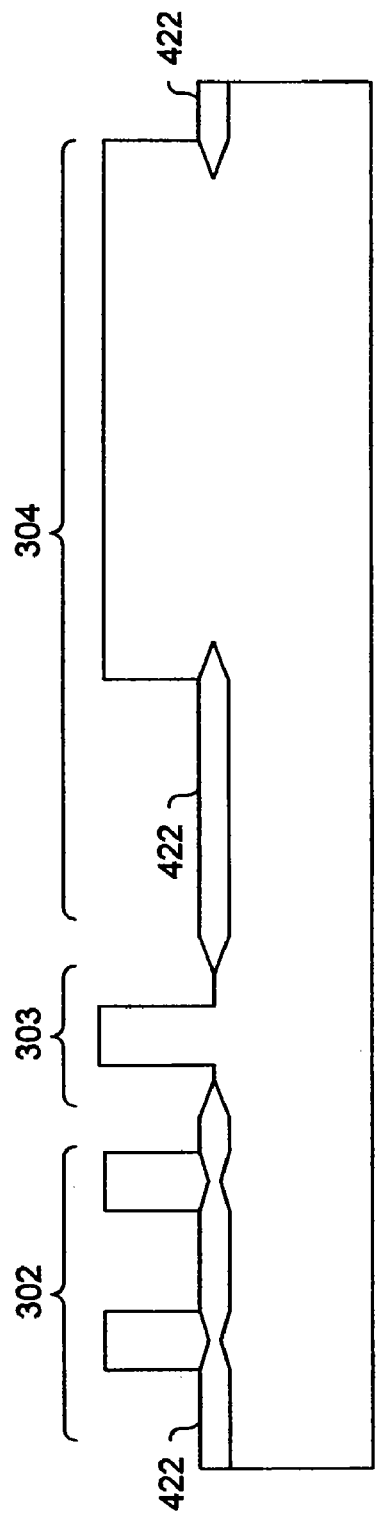
FIG. 6B is a schematic diagram showing the complete removal of the cap oxide layer shown in FIG. 5, according to an embodiment of the present invention.

FIG. 6B illustrates the complete removal of the cap oxide layer 420 shown in FIG. 5, according to an embodiment of the present invention. As shown, the cap oxide layer 420 has been completely removed from the small SOI device region 302, the reserved non-SOI region 303, and the non-SOI device region 304.

Figure 7:
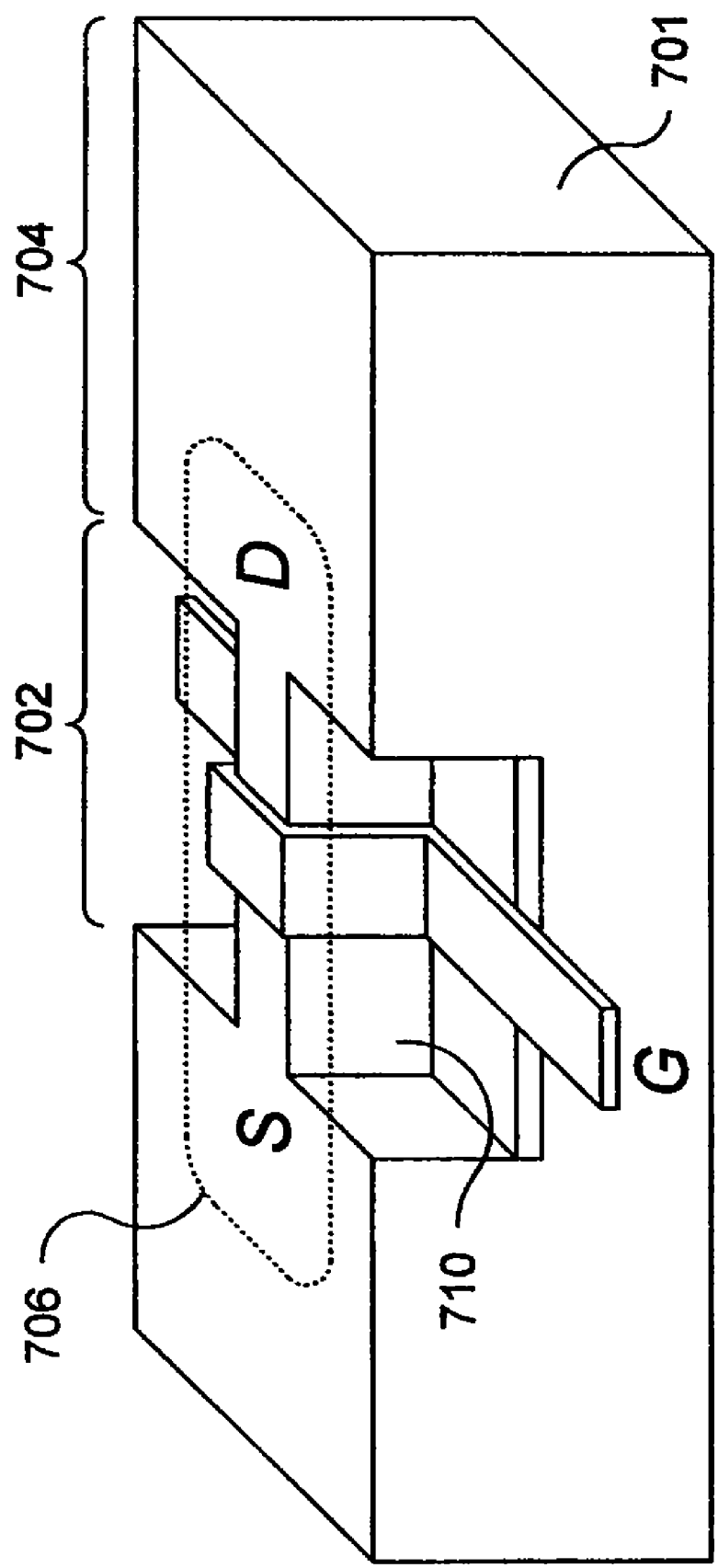
FIG. 7 is a schematic diagram of an exemplary FinFET on SOI, according to an embodiment of the present invention.

FIG. 7 illustrates an example of a FinFET (field-effect transistor) on an SOI structure, according to one embodiment of the present invention. As shown, the fin 710 (i.e., device pattern or protrusion) is made on the SOI region 702. The source and drain active region 706 are made on the non-SOI region 704. While FIG. 7 depicts one area of the source and drain active region 706 for the source (S) and one area for the drain (D), it is to be understood that each region can function as either a source or drain depending upon the voltages applied. The source/drain regions can be prepared using any suitable method of ion implantation known or to be developed. The SOI region 702 and the non-SOI device region 704 are formed from a single crystal substrate 701.

Figure 8:
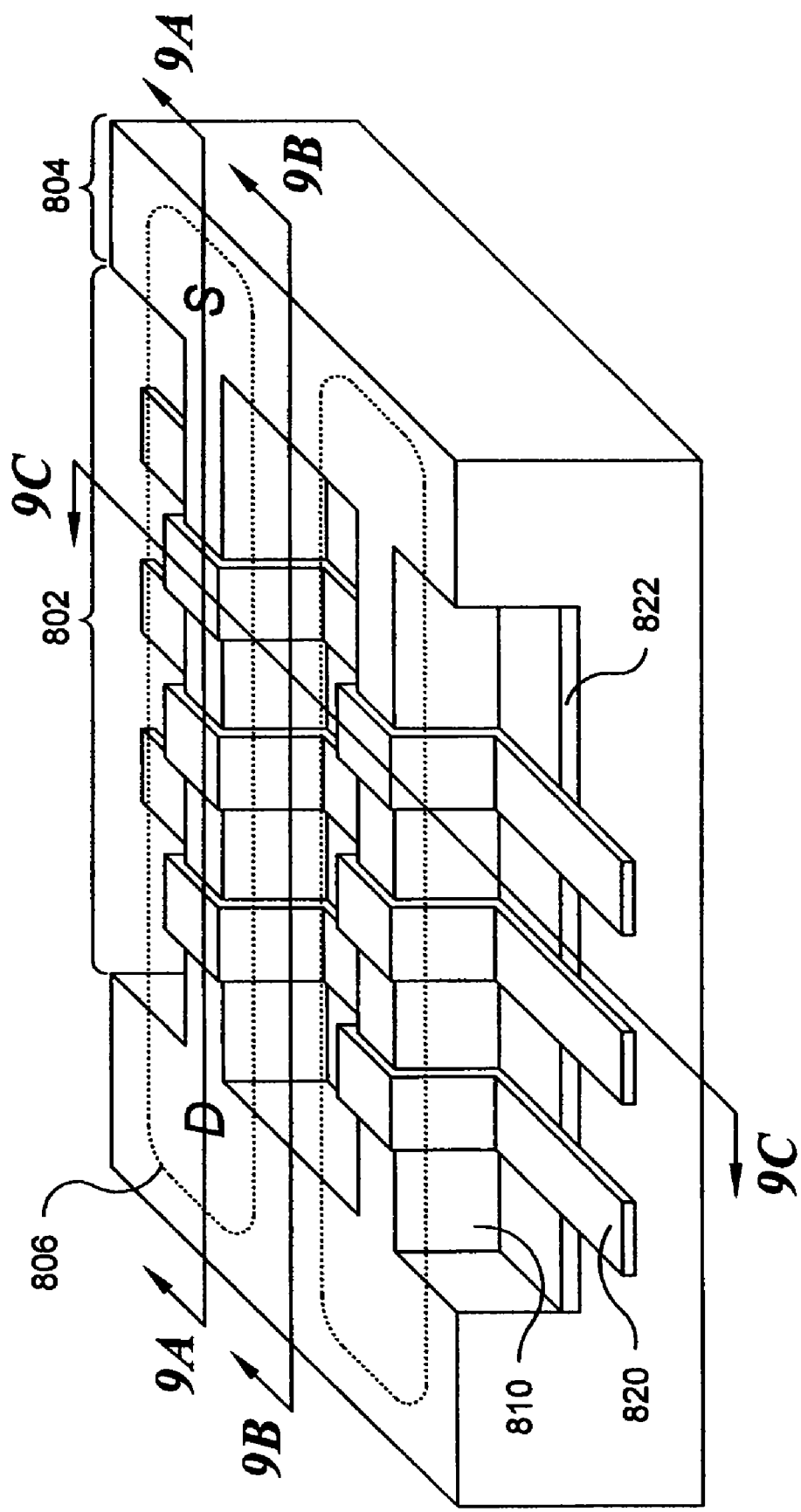
FIG. 8 is a schematic diagram of an exemplary NAND memory array with a floating-gate or SONOS FinFET on SOI, according to an embodiment of the present invention.

FIG. 8 illustrates an exemplary implementation of the present invention applied to a NAND memory array, which may employ a floating-gate or a SONOS (silicon-oxide-nitride-oxide-silicon) charge-storage structure FinFET on SOI, according to an embodiment of the present invention. In this example, the NAND memory array includes fin cells 810, source and drain region active region 806, word lines 820, and oxide insulation layer 822. The fin cells 810 are arranged on the SOI device region 802. The source and drain are arranged on the non-SOI region 804.

FIG. 9A illustrates a cross-sectional view of the NAND memory array of FIG. 8, taken along line 9A-9A. This view shows the source and drain implant region 806, oxide insulation layer 822, word lines 820, and a gate dielectric material 926 which can be disposed between the word lines 820 and the fin 810. Channel regions 930 disposed under the word lines 820 in the fin 810 can be doped either with the same type of dopant used for the source and drain regions or differently depending upon the mode of operation for the device.

FIG. 9B illustrates a cross-sectional view of the NAND memory array of FIG. 8, taken along line 9B-9B. This view shows the oxide insulation layer 822 and word lines 820 between two fins.

FIG. 9C illustrates a cross-sectional view of the NAND memory array of FIG. 8, taken along line 9C-9C. This view shows the oxide insulation layer 822 forming a bird's beak oxide layer under the fin 810 which serves as the channel regions in the areas under the gate dielectric 926 and the word lines 820.

As described above, the present invention can use a thermal oxidation process to form a partial-SOI region on a single crystal wafer. Both SOI and non-SOI devices can be formed from this process. Non-SOI regions can be etched or non-etched in the SOI patterning procedure. A spacer process or capping process can be used to protect the sidewalls from oxidation. Small patterns that do not require SOI can be protected by a reserved protection layer. Insulator thickness can be controlled by the thermal oxidation process.

Thus, the present invention provides a convenient and inexpensive method for SOI formation, which does not require any new process modules. In addition, the SOI devices can provide low off-leakage, low-gate parasitic capacitance, and can avoid latch-up issues. The SOI devices can also provide a controllable substrate bias and better thermal conductivity.

Although this specification presents exemplary applications of the present invention related to a FinFET on SOI and a NAND memory array with a floating-gate or SONOS FinFET on SOI, one of ordinary skill in the art would appreciate that the present invention has many other possible applications, such as mask ROM memory, flash memory, dynamic random access memory (DRAM), microprocessors, chipsets, and controllers. The present invention should therefore be considered broadly applicable to any device in need of a partial silicon-on-insulator structure.

In describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A partial silicon-on-insulator structure comprising:
   a single crystal silicon substrate having an device pattern disposed on a surface thereof, the device pattern comprising a semiconductor protrusion and having a non-SOI region and an SOI region; and
   an insulation layer disposed in the SOI region over the single crystal silicon substrate,
   wherein the semiconductor protrusion is partially on the insulation layer in the SOI region, covers the non-SOI region entirely, and is directly on the single crystal silicon substrate in the non-SOI region.

2. The structure according to claim 1, further comprising a cap oxide layer disposed on at least one of the semiconductor protrusion and a portion of the non-SOI region.

3. The structure according to claim 1, the cap oxide layer disposed on at least a portion of the non-SOI region.

4. The structure according to claim 1, wherein the non-SOI region comprises a non-SOI protrusion having a width greater than 1000 nm.

5. The structure according to claim 1, wherein the insulation layer comprises a thermally grown oxide.

* * * * *